US012399202B2

(12) United States Patent
Toni et al.

(10) Patent No.: US 12,399,202 B2
(45) Date of Patent: Aug. 26, 2025

(54) IMPEDANCE CONTROLLED AFE

(71) Applicant: Endura IP Holdings Ltd., George Town (KY)

(72) Inventors: Arnaud Toni, San Diego, CA (US); Gol Nagdebe, San Diego, CA (US)

(73) Assignee: Endura IP Holdings Ltd., George Town (KY)

( * ) Notice: Subject to any disclaimer, the term of this patent is extended or adjusted under 35 U.S.C. 154(b) by 58 days.

(21) Appl. No.: 18/103,168

(22) Filed: Jan. 30, 2023

(65) Prior Publication Data
US 2023/0243877 A1  Aug. 3, 2023

Related U.S. Application Data

(60) Provisional application No. 63/267,260, filed on Jan. 28, 2022.

(51) Int. Cl.
*G01R 27/26* (2006.01)
*H03K 3/037* (2006.01)
*H03K 19/20* (2006.01)

(52) U.S. Cl.
CPC ......... *G01R 27/2605* (2013.01); *H03K 3/037* (2013.01); *H03K 19/20* (2013.01)

(58) Field of Classification Search
CPC ........ H03M 3/30; H03M 3/458; H03M 3/464; H03M 3/494; H03K 3/037; G01R 27/02; G01R 27/26; G01R 27/2605; G01D 5/24
See application file for complete search history.

(56) References Cited

U.S. PATENT DOCUMENTS

| 7,321,271 | B2 * | 1/2008 | Takinami | H03L 7/099 331/177 V |
| 10,382,054 | B2 * | 8/2019 | Bohannon | G06F 3/044 |
| 2011/0012618 | A1 * | 1/2011 | Teterwak | G01D 5/2417 324/686 |
| 2011/0159828 | A1 * | 6/2011 | Kasha | H04B 1/28 455/150.1 |
| 2013/0187803 | A1 * | 7/2013 | Kaald | H03M 3/37 341/143 |

(Continued)

FOREIGN PATENT DOCUMENTS

| CN | 119173740 A | 12/2024 |
| EP | 4469757 A1 | 12/2024 |

(Continued)

OTHER PUBLICATIONS

International Preliminary Report on Patentability for International Application PCT/US2023/011886, Report issued Jul. 30, 2024, Mailed Aug. 8, 2024, 05 Pgs.

*Primary Examiner* — Huy Q Phan
*Assistant Examiner* — David B Frederiksen
(74) *Attorney, Agent, or Firm* — KPPB LLP

(57) ABSTRACT

An analog front-end (AFE) for an impedance sensor uses digitally controlled impedances to modulate a differential input from an impedance-based sensor. The digitally controlled impedances may be coupled between the differential input and one or more reference voltages. In some embodiments use of the digitally controlled impedances may allow for omission of a preamplifier from the AFE, or a reduction in gain of the preamplifier, reducing noise associated with the preamplifier.

14 Claims, 13 Drawing Sheets

(56) References Cited

U.S. PATENT DOCUMENTS

| | | | | |
|---|---|---|---|---|
| 2013/0187804 | A1* | 7/2013 | Kaald | H03M 3/37 |
| | | | | 341/143 |
| 2014/0078096 | A1* | 3/2014 | Tan | G06F 3/044 |
| | | | | 345/174 |
| 2016/0140376 | A1* | 5/2016 | Kremin | G06V 40/1306 |
| | | | | 382/124 |
| 2016/0380646 | A1* | 12/2016 | Kauffman | H03M 1/0607 |
| | | | | 341/118 |
| 2018/0012588 | A1 | 1/2018 | Albers et al. | |
| 2018/0259364 | A1* | 9/2018 | Furubayashi | H03K 17/955 |
| 2019/0149163 | A1* | 5/2019 | Bohannon | H03K 17/962 |
| | | | | 345/174 |
| 2022/0052707 | A1* | 2/2022 | Pietri | H03M 3/496 |

FOREIGN PATENT DOCUMENTS

| | | |
|---|---|---|
| KR | 20210046520 A | 4/2021 |
| WO | 2023147132 A1 | 8/2023 |

\* cited by examiner

IMPEDANCE CONTROLLED AFE

CROSS REFERENCE TO RELATED APPLICATION

This application claims the benefit of the filing date of U.S. Provisional Patent Application No. 63/267,260, filed on Jan. 28, 2022, the disclosure of which is incorporated by reference herein.

BACKGROUND OF THE INVENTION

The present disclosure relates generally to analog front-end circuits for sensors, and more particularly to impedance-controlled analog front-end circuits.

Analog front-ends (AFEs) are used to process sensor information for a variety of sensors. In many instances the sensors may be capacitive sensors. Capacitive sensors may include MEMs capacitors or condensors, for example in microphones, piezoelectric transducers, for example in a variety of applications, or various electrode sending devices, for example in the medical domain. In some instances other sensors may be used, for example resistive sensors may be in the form of piezo resistive silicon nanowire.

Sensor readout may include amplification of signals from the sensor (for example by a preamplifier), filtering and analog-to-digital conversion of the amplified signals, and possibly various digital operations on the digitized signals. Preamplifiers are commonly used to allow for processing of low power signals sourced by the sensors.

The amplification and analog-to-digital conversion of the signals may, however, contribute noise to signals from the sensors. Use of preamplifiers with higher gains may be generally able to allow for processing of lower power input signals, but may also generate excessive total harmonic distortion for higher power input signals. For example, for audio microphones, sensitive microphones with high gain preamplifiers may too often reach their acoustic overload point (sometimes considered to be at 10% total harmonic distortion).

BRIEF SUMMARY OF THE INVENTION

Some embodiments provide an impedance controlled analog front end (AFE) for an impedance-based sensor, comprising: a filter with an input coupled to at least one output of an impedance-based sensor; an analog-to-digital converter (ADC) with an input coupled to an output of the filter, the ADC configured to provide a digital output; and a digitally controlled impedance coupling the input to the filter to a reference voltage, the impedance of the digitally controlled impedance being based on the digital output of the ADC.

In some embodiments the impedance-based sensor is a capacitive sensor, and the digitally controlled impedance is a digitally controlled capacitance. In some embodiments the digitally controlled capacitance comprises a digitally controlled varactor. In some embodiments the digital controlled varactor includes a plurality of cells, each cell including a capacitance coupled between an output of the impedance-based sensor and one or more reference voltages. the one or more reference voltages consists of three reference voltages. In some embodiments the digitally controlled capacitance comprises a segmented charge digitally controlled impedance. In some embodiments the ADC comprises a quantizer. In some embodiments the ADC comprises a voltage-controlled oscillator (VCO) quantizer. In some embodiments the ADC comprises a phase quantizer. In some embodiments the filter comprises an integrator. In some embodiments the input to the filter is a differential input, with a digitally controlled impedance coupling each of the differential inputs to a reference voltage.

These and other aspects of the invention are more fully comprehended upon review of this disclosure.

DETAILED DESCRIPTION

Figure 1:
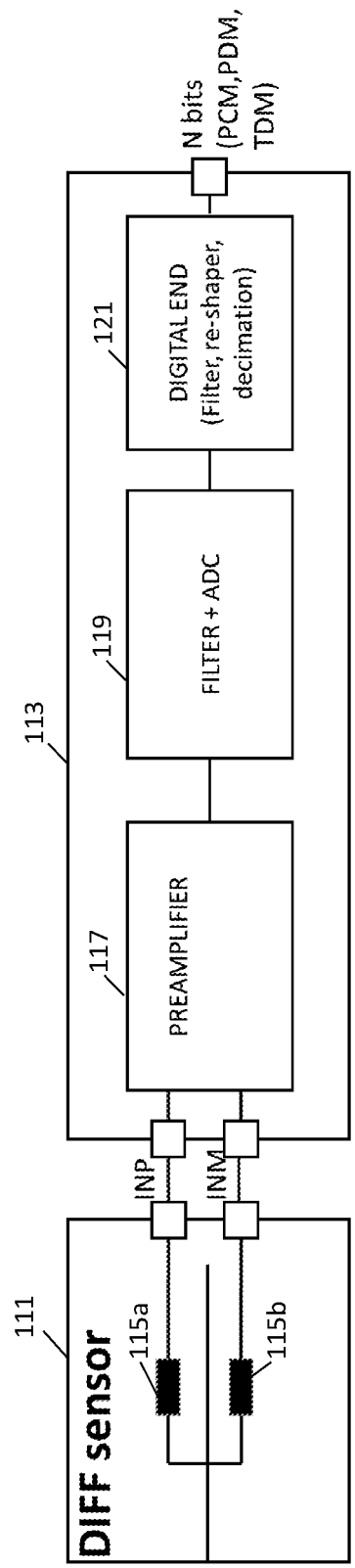
FIG. 1 is a block diagram of a differential sensor coupled to an analog front-end (AFE).

FIG. 1 is a block diagram of a differential sensor coupled to an analog front-end (AFE). The differential sensor includes a pair of sensors 115a,b. The sensors are generally capacitive-based sensors, and may be, for example, pressure detection sensors such as audio condensers or MEMs capacitive sensors, piezoelectric sensors, or a variety of electrode sensors used in the medical fields. The sensors may be other types of sensors, for example resistive based sensors such as piezoresistive silicon nanowire sensors. The sensors provide a differential output to a readout circuit. In some embodiments the pair of sensors may be replaced by a single sensor providing a differential output. The readout circuit provides an analog front-end (AFE) 113 for the sensors.

The AFE of FIG. 1 includes a preamplifier 117 for amplifying the low-level differential signal. The preamplifier may include, for example, a voltage follower circuit, a charge amplifier circuit, or some other amplification circuitry. The amplified signal is provided to a filter and analog-to-digital converter 119, which filters and digitizes the amplified signal. A digital end 121 of the AFE may perform various functions, including filtering of the digital signal, reshaping the digital signal, decimating the digital signal, or other functions. The digital end, and the AFE as a whole, provides an N bit signal representative of the input analog signal. The N bit signal may be in the form of a pulse code modulated (PCM) signal, a pulse density modulated (PDM) signal, a time division multiplexed (TDM) signal, or a signal in some other format.

The preamplifier generally introduces noise into the signal, and total noise may also increase with input signal magnitude. Preamplifiers with higher gains may effectively limit effective dynamic range of the AFE.

Figure 2:
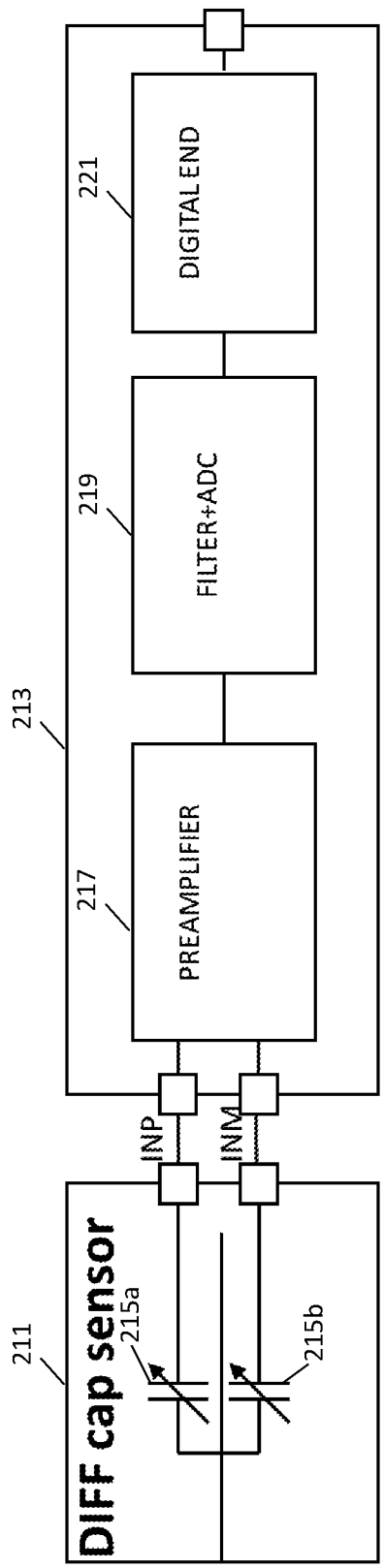
FIG. 2 is a block diagram of a differential capacitive sensor coupled to an AFE.

FIG. 2 is a block diagram of a differential capacitive sensor coupled to an AFE. The differential capacitive sensor includes a pair of capacitors 215a,b, with the differential capacitive sensor providing a differential output. In some embodiments only a single capacitor may be used. In some embodiments the sensor may be a single ended sensor. The capacitors may be, for example, MEMs capacitors.

As in FIG. 1, the AFE 213 providing the readout circuitry includes a preamplifier 217 for amplifying the low-level differential signal. The preamplifier may include, for example, a voltage follower circuit, a charge amplifier circuit, or some other amplification circuitry. The amplified signal is provided to a filter and analog-to-digital converter 219, which filters and digitizes the amplified signal. The ADC may be, for example, a delta sigma ADC, a pipelined ADC, a successive approximation ADC, or some other ADC. A digital end 221 of the AFE may perform various functions, including filtering of the digital signal, reshaping the digital signal, decimating the digital signal, or other functions. The digital end, and the AFE as a whole, provides an N bit signal representative of the input analog signal. The N bit signal may be in the form of a pulse code modulated (PCM) signal, a pulse density modulated (PDM) signal, a time division multiplexed (TDM) signal, or a signal in some other format.

The differential capacitive sensor may be used, in various embodiments, as an acoustic sensor, for example a microphone. As with the general sensor of FIG. 1, increased gain of the preamplifier may provide greater sensitivity for the microphone. Noise associated with the higher gain may result in the microphone reaching its acoustic overload point, particularly for larger input signals, decreasing the overall dynamic range of the microphone.

Figure 3:
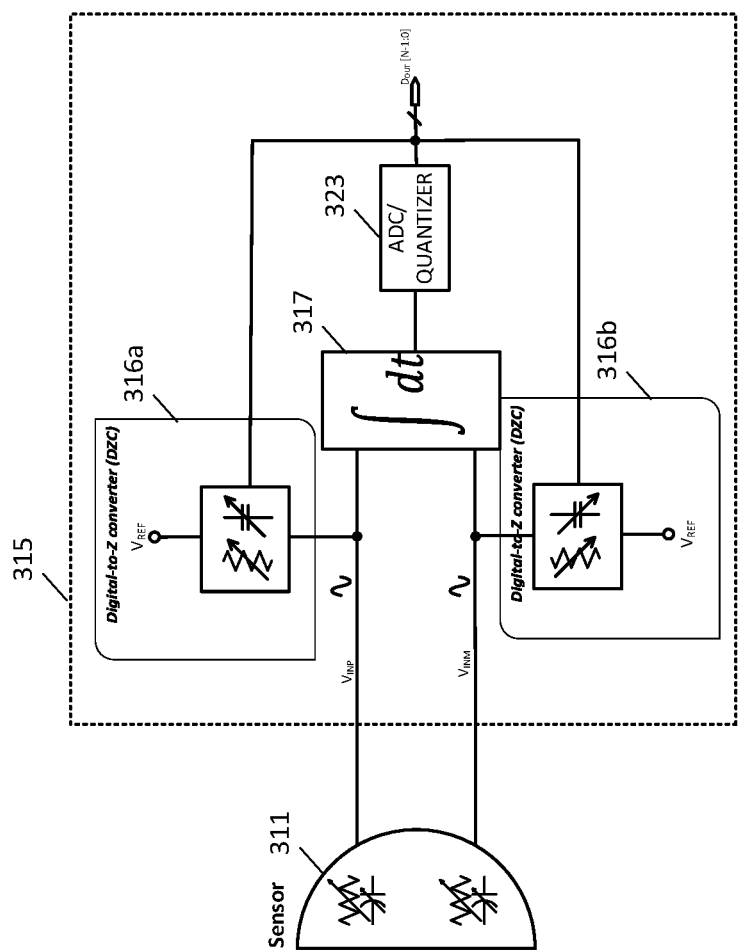
FIG. 3 is a semi-schematic, semi-block diagram of a differential sensor coupled to a digitally controlled impedance AFE in accordance with aspects of the invention.

FIG. 3 is a semi-schematic, semi-block diagram of a differential sensor coupled to a digitally controlled impedance AFE in accordance with aspects of the invention. The differential sensor 311 provides a differential output to an AFE 315. The AFE of FIG. 3 includes a filter 317 and an ADC/quantizer, similar to the AFEs of FIGS. 1 and 2. The filter filters the differential output of the differential sensor, and the ADC/quantizer converts the filtered signal to a quantized digital signal. In some embodiments the ADC may be an oversampled Delta-Sigma ADC. In various embodiments, and as shown in FIG. 3, the AFE does not include a preamplifier. In various embodiments a preamplifier may be used between the sensor and the filter, but generally a preamplifier with a lower gain.

The AFE of FIG. 3 also includes a pair of controlled impedances 316a,b, each coupled between a reference voltage and a corresponding one of the differential inputs from the differential sensor. The controlled impedances are coupled to the differential inputs prior to the filter in the signal processing chain. In some embodiments the filter is an integrator. The sensors of the differential sensor include capacitance and/or resistance. The controlled impedances similarly include a variable capacitance and/or resistance. In most embodiments the controlled impedances have impedance of the same type as the sensors of the differential sensor. In some embodiments the sensors are capacitive sensors. In some embodiments the sensors are resistive sensors. In some embodiments the impedance of the controlled impedances is capacitive when the sensors are capacitive sensors. In some embodiments the impedance of the controlled impedances is resistive when the sensors are resistive sensors.

Magnitude of impedance of the controlled impedances is varied based on output of the ADC/quantizer. In the embodiment of FIG. 3, the magnitude of impedance of the controlled impedance is modulated by output of the ADC/quantizer. In some embodiments the impedance of the controlled impedances is modulated so that inputs to the filter may be considered virtual grounds.

Figure 4:
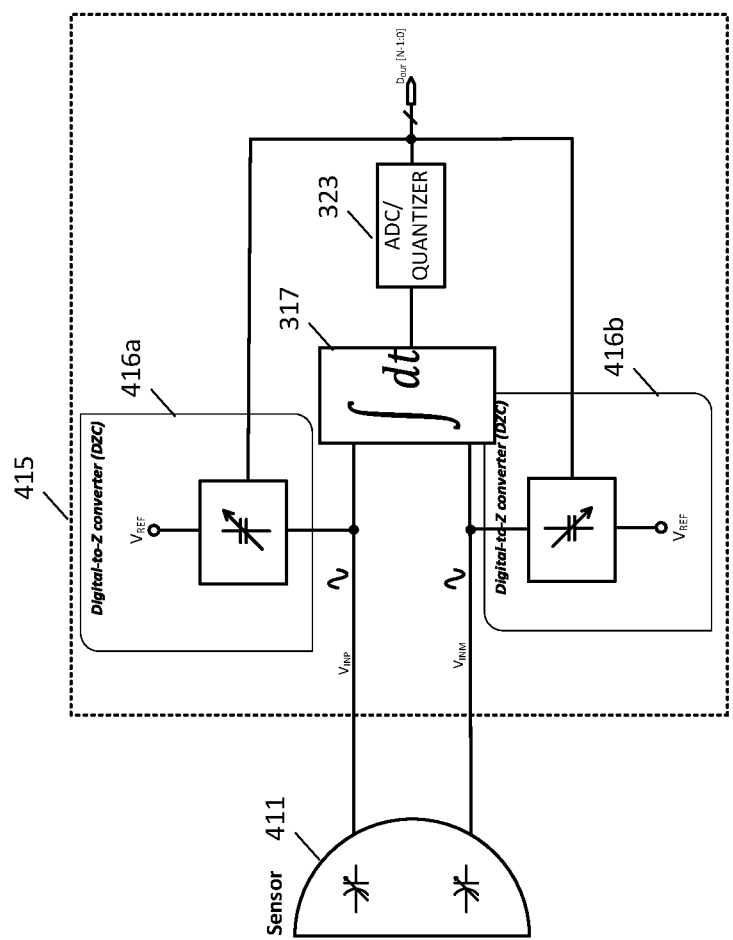
FIG. 4 is a semi-schematic, semi-block diagram of a differential capacitive sensor coupled to a digitally controlled impedance AFE in accordance with aspects of the invention.

FIG. 4 is a semi-schematic, semi-block diagram of a differential capacitive sensor coupled to a digitally controlled impedance AFE in accordance with aspects of the invention. The block diagram of FIG. 4 is similar to the block diagram of FIG. 3, but with the sensor and the controlled impedances using capacitances. In FIG. 4, the sensor includes a pair of capacitive sensors, for example MEMs sensors, and the sensor provides a differential output $V_{INP}$, $V_{INM}$. The differential output is provided to a filter 317 of an AFE 415. Output of the filter is provided to and ADC/quantizer, which digitizes its input signal to an N bit output signal.

Digitally controlled impedances 416a,b are each coupled between a voltage reference and a corresponding one of the differential outputs of the sensor. For example, in FIG. 4, digitally controlled impedance 416a is coupled to the $V_{INP}$ differential output, and digitally controlled impedance 416b is coupled to the $V_{INM}$ differential output. In some embodiments the digitally controlled impedances may be controllably coupled at various times to a positive voltage reference $V_{Ref}$, a negative voltage reference $-V_{Ref}$, or ground $V_{Gnd}$, instead of just a single voltage reference. The digitally controlled impedances have a controllable impedance. The digitally controlled impedances are determined based on the N bit digital output signal from the ADC/quantizer. The digitally controlled impedances, which may be termed a digital-to-z converter, include a variable capacitance. As with the AFE of FIG. 3, the impedance of the digitally controlled impedances may be modulated using the N bit digital output signal so that inputs to the filter may be considered virtual grounds.

Figure 5:
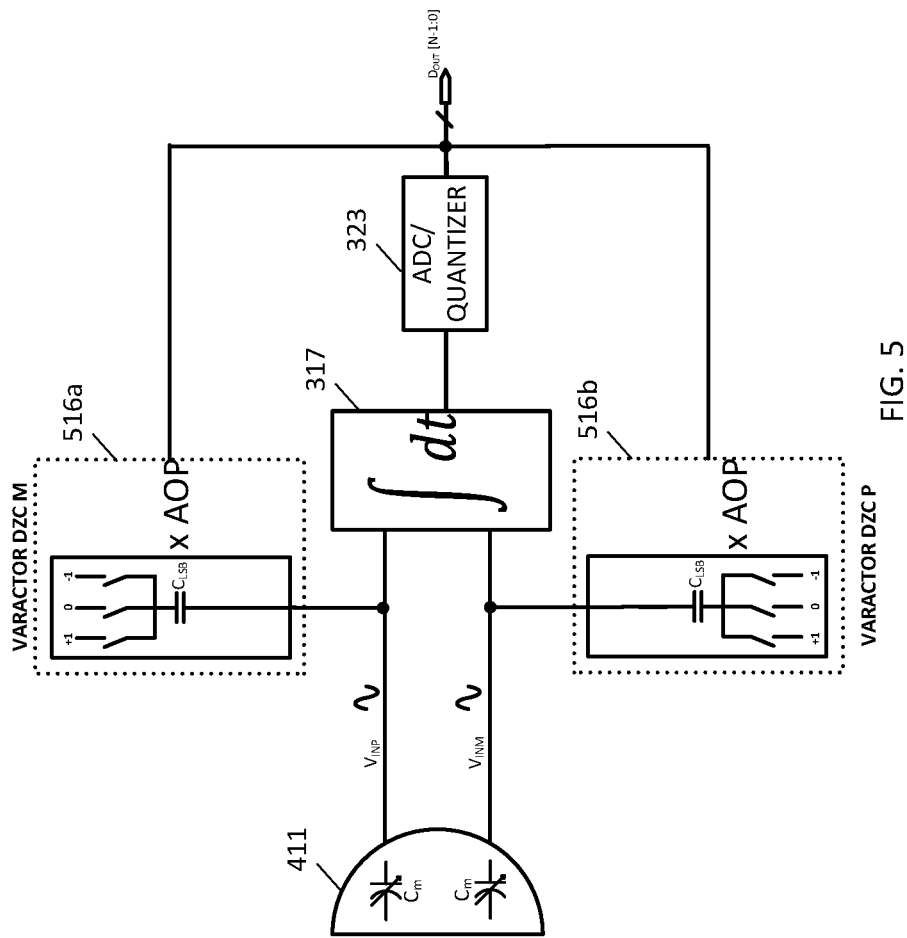
FIG. 5 is a semi-schematic, semi-block diagram of a differential sensor coupled to a varactor digitally controlled impedance AFE in accordance with aspects of the invention.

FIG. 5 is a semi-schematic, semi-block diagram of a differential sensor coupled to a varactor digitally controlled impedance AFE in accordance with aspects of the invention. As in FIG. 4, the differential sensor 411 is a capacitive sensor. And, as in FIG. 4, the differential sensor provides a differential output to a filter 317, which in turn provides a filtered signal to and ADC/quantizer 323. Also similar to FIG. 4, digitally controlled impedances 516a,b are each coupled between voltage references and a corresponding one of the differential outputs of the sensor.

In FIG. 5, the digitally controlled impedances may be considered varactor digital-to-z converters (DZC). The varactor DZC of FIG. 5 includes a plurality of cells. In some embodiments a number of the plurality of cells is proportional to a desired acoustic overload point. Each cell may be comprised of a capacitor, which may be considered a least significant capacitor with a capacitance $C_{LSB}$. Each capacitor has one place coupled to the corresponding differential output and another plate coupled to either $V_{REF}$, V-REF, or $V_{GND}$. In some embodiments the capacitance $C_{LSB}$ is equal to $(\Delta C_{m\_max}/N) \times (V_{BIAS}/V_{REF})$, assuming the sensor is biased with $V_{BIAS}$ and the ADC has N levels of quantization. As an example, with a 2 pF sensor and 143 dB SPL at −38 dBV, the total DAC capacitance is 10 pF and, for a 256 level quantizer, the capacitance of each capacitor is 39 fF.

Figure 6:
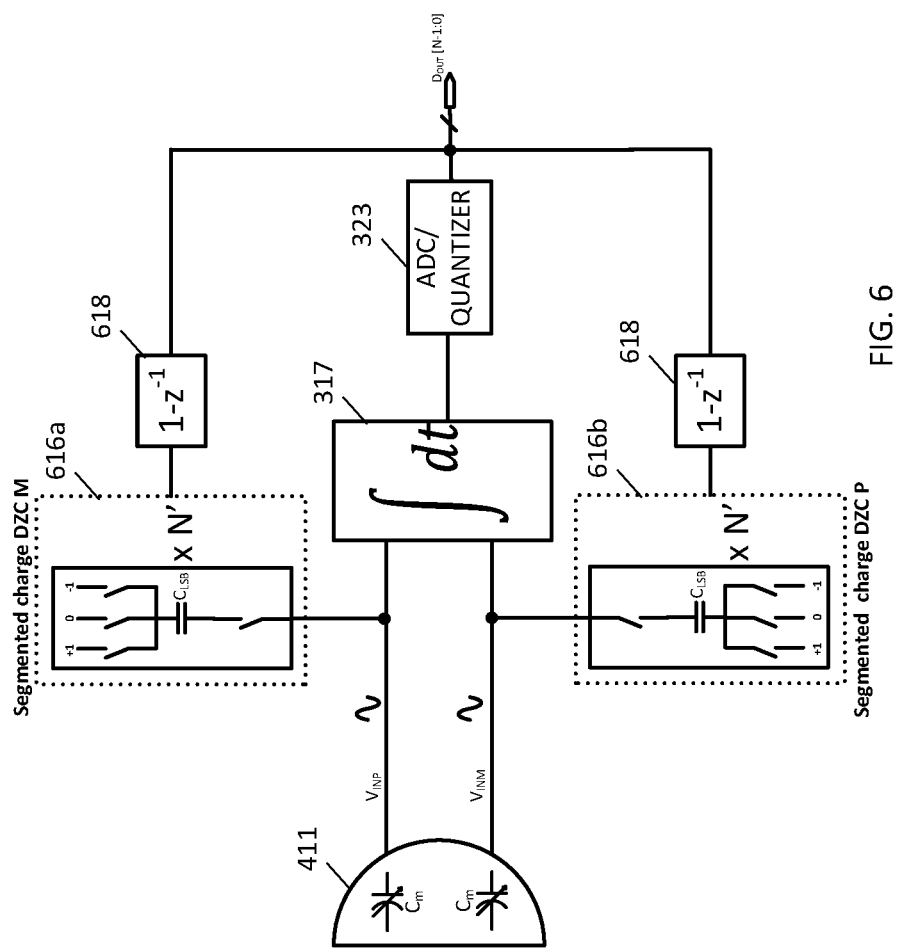
FIG. 6 is a semi-schematic, semi-block diagram of a differential sensor coupled to a segmented digitally controlled impedance AFE in accordance with aspects of the invention.

FIG. 6 is a semi-schematic, semi-block diagram of a differential sensor coupled to a segmented digitally controlled impedance AFE in accordance with aspects of the invention. As in FIGS. 4 and 5, the differential sensor 411 is a capacitive sensor. And, as in FIGS. 4 and 5, the differential sensor provides a differential output to a filter 317, which in turn provides a filtered signal to and ADC/quantizer 323. Also similar to FIG. 5, digitally controlled impedances 616a,b are each coupled between voltage references and a corresponding one of the differential outputs of the sensor.

In FIG. 6, the digitally controlled impedances are what may be termed segmented DZCs. The segmented DZCs are similar to the varactor DZCs of FIG. 5, but generally with a reduced number of cells as compared to the varactor DZCs. In some embodiments each segmented DZC includes 8 cells. The segmented DZCs each use output of a first order difference block 618 to track slope of output of the ADC/quantizer. In operation, the segmented DZCs operate as the varactor DZCs, until the capacitors of the segmented DZCs are all charged to a maximum or a minimum level. If the capacitors of the segmented DZCs are all charged to a maximum or a minimum level, a reset operation is performed to allow the segmented DZCs to allow operation as a varactor DZC to resume. Accordingly, for small signals, noise of the segmented DZC is largely the same as for the varactor DZC. However, with input signal strength about the reset points, noise modulation may occur.

Figure 7:
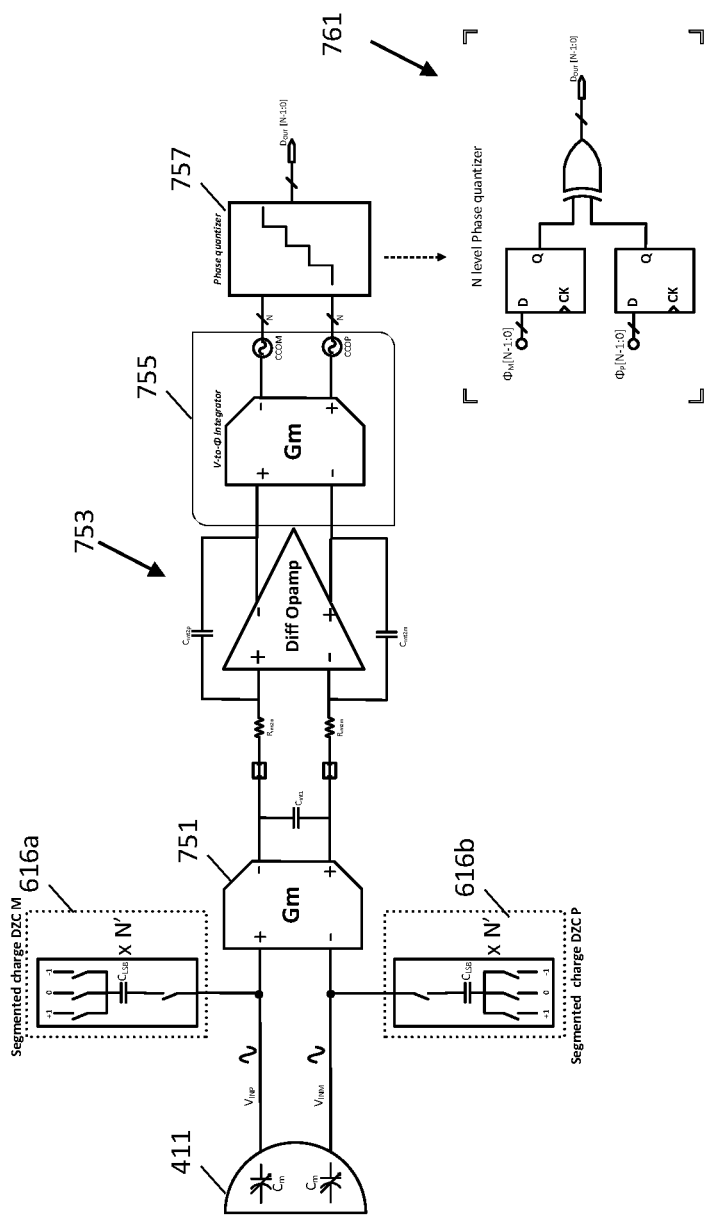
FIG. 7 is a semi-schematic, semi-block diagram of a differential sensor coupled to a segmented digitally controlled impedance AFE using a VCO quantizer in accordance with aspects of the invention.

FIG. 7 is a semi-schematic, semi-block diagram of a differential sensor coupled to a segmented digitally controlled impedance AFE using a VCO quantizer in accordance with aspects of the invention. Use of a VCO quantizer may be beneficial in reducing signal quantization noise ratios in the AFE. In the example of FIG. 7, the VCO quantizer includes a voltage to phase integrator 755, with outputs operated on by a phase quantizer 757. The phase quantizer may be implemented, in some embodiments, using an N level phase quantizer 761. The voltage to phase integrator operates on a filtered signal provided by an integrator 753. The integrator receives, for example, a signal from a differential capacitive sensor 411 that is passed through an inverter 751. The signal lines from the differential capacitive sensor are also each coupled to corresponding segmented charge DZCs 616a,b.

Figure 8:
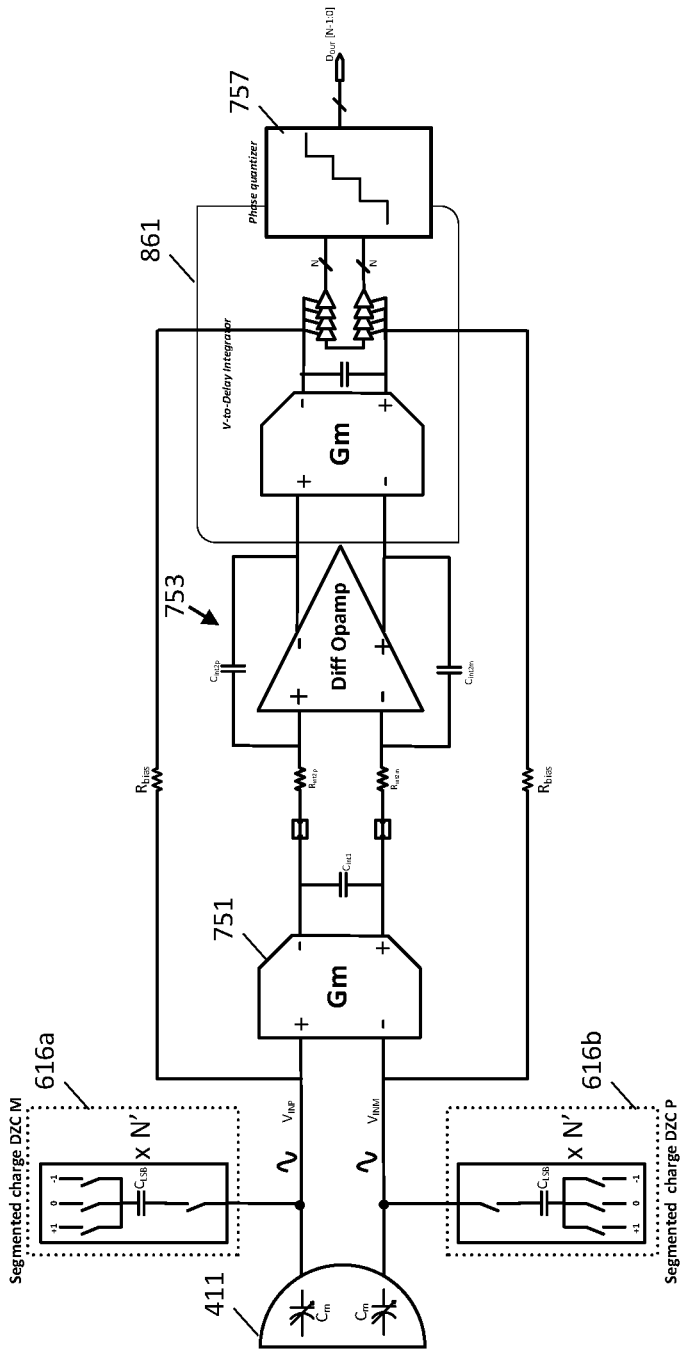
FIG. 8 is a semi-schematic, semi-block diagram of a differential sensor coupled to a segmented digitally controlled impedance AFE using a voltage controlled delay loop and phase quantizer in accordance with aspects of the invention.

Alternatively, a voltage controlled delay loop may be used, for example as illustrated in FIG. 8. FIG. 8 is a semi-schematic, semi-block diagram of a differential sensor coupled to a segmented digitally controlled impedance AFE using a voltage controlled delay loop (VCDL) and phase quantizer in accordance with aspects of the invention. In FIG. 8, the VCDL includes a voltage to delay integrator 861 and phase quantizer 757, with the voltage to delay integrator replacing the voltage to phase integrator of FIG. 7.

Figure 9:
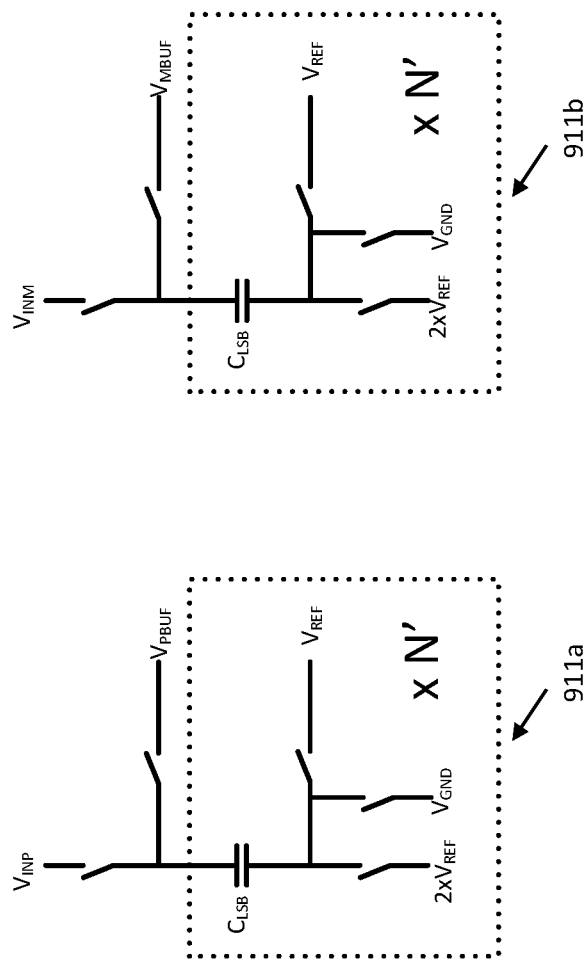
FIG. 9 is a semi-schematic of a digitally controlled impedance using static references, in accordance with aspects of the invention.

FIG. 9 is a semi-schematic of cells of a segmented digitally controlled impedance using static references, in accordance with aspects of the invention. The segmented DZC cells 911a,b are coupled to $V_{INP}$ and $V_{INM}$, providing the outputs from a differential sensor, respectively. The capacitator has one plate coupled to $V_{INP}$ or $V_{INM}$, by a first switch, and to $V_{PBUF}$ or $V_{MBUF}$, by a second switch. $V_{PBUF}$ or $V_{MBUF}$ may be coupled to input buffers for $V_{INP}$ or $V_{INM}$, respectively, during reset operations. The capacitor has another plate coupled to one of voltage references $V_{ref}$, $2 \times V_{ref}$, or ground, by three corresponding switches.

The cells of FIG. 9 may also be used for varactor DZC cells, without use of the first and second switches and, in some embodiments, the input buffers.

Figure 10:
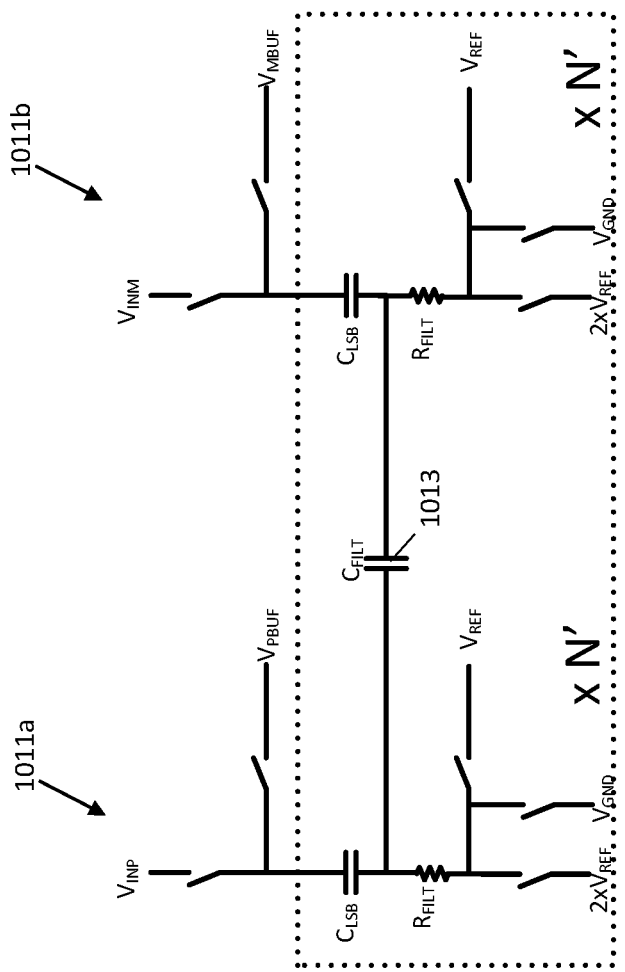
FIG. 10 is a semi-schematic of a digitally controlled impedance using static references and including a pole, in accordance with aspects of the invention.

FIG. 10 is a semi-schematic of cells of a segmented digitally controlled impedance using static references and including a pole, in accordance with aspects of the invention. The cells 1011a,b of FIG. 10 are generally as discussed with respect to the cells of FIG. 9. The cells of FIG. 10, however, also include a pole. In FIG. 10, the pole is provide by use of a capacitor 1013 coupling the voltage reference side plates of the capacitors of the cells 1011a,b, along with a resistance between those plates and the voltage references. Again, the cells of FIG. 10 may be used, in some embodiments, for varactor DZC cells, without use of the first and second switches and, in some embodiments, the input buffers.

Figure 11:
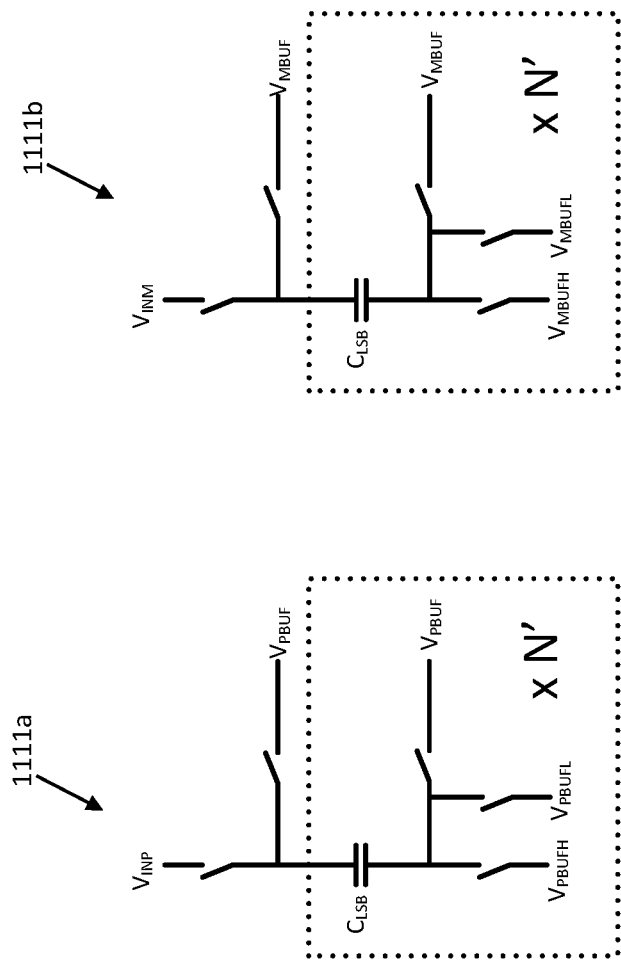
FIG. 11 is a semi-schematic of a digitally controlled impedance using follower references, in accordance with aspects of the invention.

FIG. 11 is a semi-schematic of cells of a segmented digitally controlled impedance using follower references, in accordance with aspects of the invention. The cells 1111a,b are as discussed with respect to the cells 911a,b of FIG. 9, but with the voltage references tracking voltage of the outputs of the differential sensor, instead of being static references. So while the reference voltages of FIG. 9 were references $V_{ref}$, $2 \times V_{ref}$ and ground, the corresponding reference voltages for cell 1111a may be $V_{PBUF}$ minus a static reference $V_{ref}$, $V_{PBUF}$ plus the static reference $V_{ref}$, and $V_{ref}$. Similarly, the corresponding reference voltages for cell 1111b may be $V_{MBUF}$ minus a static reference $V_{ref}$, $V_{MBUF}$ plus the static reference $V_{ref}$, and $V_{ref}$. A switched capacitor adder/subtractor may be used to generate $V_{PBUF}$ minus a static reference $V_{ref}$, $V_{PBUF}$ plus the static reference $V_{ref}$, and $V_{MBUF}$ minus a static reference $V_{ref}$, $V_{MBUF}$ plus the static reference $V_{ref}$. In some embodiments a dummy version may be used to keep the same switching current loading the switched capacitor references for linearity and noise purposes. And, again, the cells of FIG. 11 may be used, in some embodiments, for varactor DZC cells, without use of the first and second switches and, in some embodiments, the input buffers.

Figure 12:
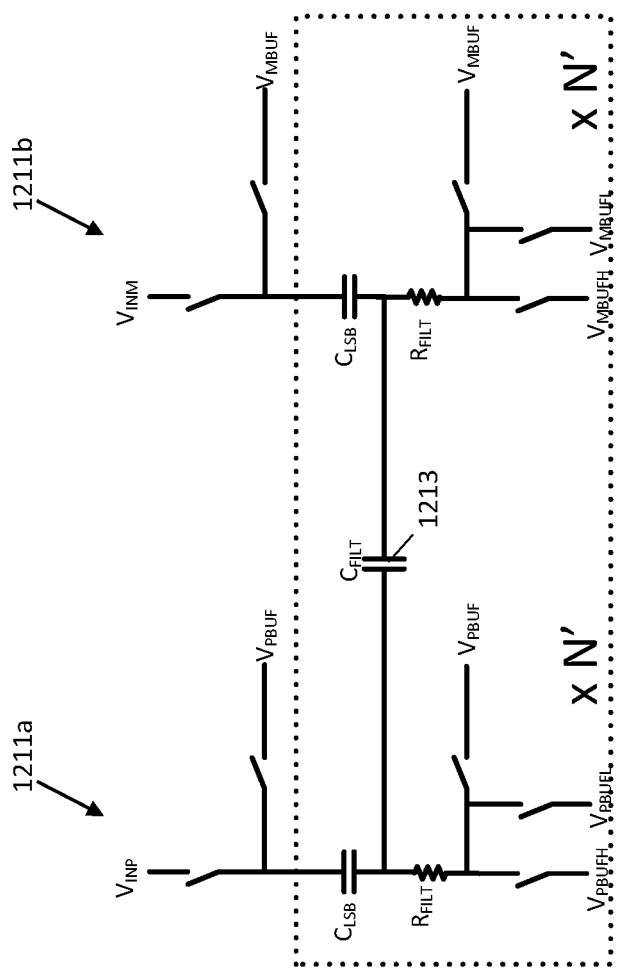
FIG. 12 is a semi-schematic of a digitally controlled impedance using follower references and including a pole, in accordance with aspects of the invention.

FIG. 12 is a semi-schematic of cells of a digitally controlled impedance using follower references and including a pole, in accordance with aspects of the invention. The cells 1211a,b of FIG. 12 are generally as discussed with respect to the cells of FIG. 11. The cells of FIG. 12, however, also include a pole. As in FIG. 10, in FIG. 12 the pole is provide by use of a capacitor 1213 coupling the voltage reference side plates of the capacitors of the cells 1011a,b, along with a resistance between those plates and the voltage references. The cells of FIG. 12 may be used, in some embodiments, for varactor DZC cells, without use of the first and second switches and, in some embodiments, the input buffers.

Figure 13:
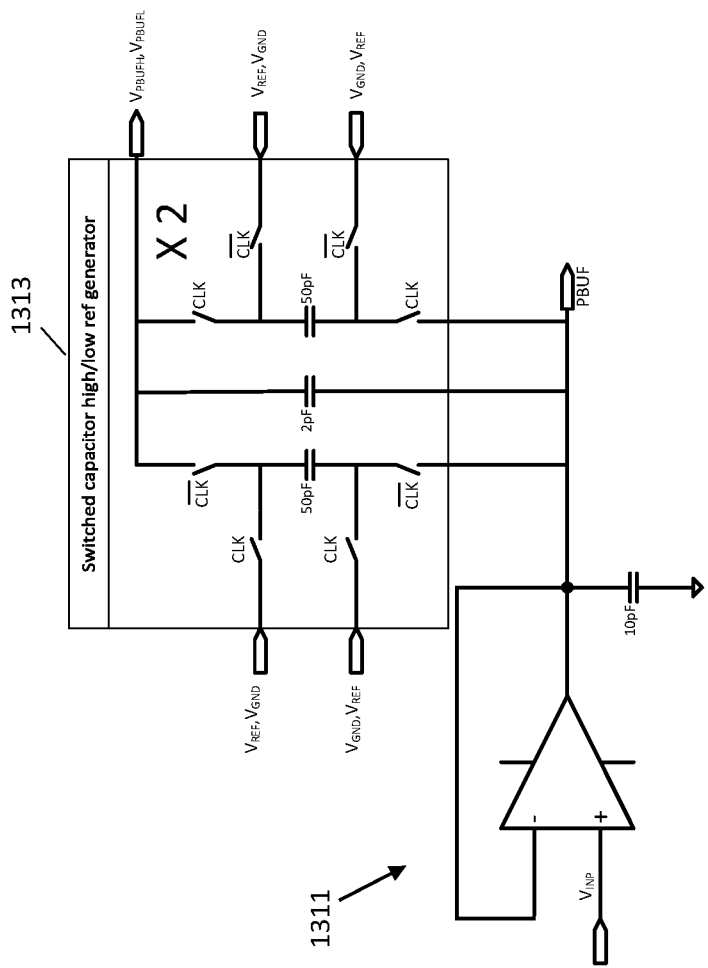
FIG. 13 is a schematic of an example of a switched capacitor high and low references generator, in accordance with aspects of the invention.

FIG. 13 is a schematic of an example of a switched capacitor high and low references generator, in accordance with aspects of the invention. FIG. 13 also shows an example of an input buffer 1311 for $V_{INP}$. A switched capacitor topology 1313 is used to create the voltage references tracking voltage of the outputs of the differential sensor.

Although the invention has been discussed with respect to various embodiments, it should be recognized that the invention comprises the novel and non-obvious claims supported by this disclosure.

What is claimed is:

1. An impedance controlled analog front end (AFE) for an impedance-based sensor, comprising:
   a filter with a first input of a differential input coupled to a first output of a differential output of an impedance-based sensor and a second input of the differential input coupled to a second output of the differential output of the impedance-based sensor;
   an analog-to-digital converter (ADC) with an input coupled to an output of the filter, the ADC configured to provide a digital output; and
   a first digitally controlled impedance coupling the first input to the filter to a reference voltage, and a second digitally controlled impedance coupling the second input to the filter to the reference voltage, the impedance of the first digitally controlled impedance being based on the digital output of the ADC.

2. The impedance controlled AFE of claim 1, wherein the impedance-based sensor is a capacitive sensor, and the first digitally controlled impedance is a first digitally controlled capacitance.

3. The impedance controlled AFE of claim 2, wherein the first digitally controlled capacitance comprises a first digitally controlled varactor.

4. The impedance controlled AFE of claim 3, wherein the first digital controlled varactor includes a plurality of cells, each cell including a capacitance coupled between an output of the impedance-based sensor and one or more reference voltages.

5. The impedance controlled AFE of claim 4, wherein the one or more reference voltages consists of three reference voltages.

6. The impedance controlled AFE of claim 2, wherein the digitally controlled capacitance comprises a segmented charge digitally controlled impedance.

7. The impedance controlled AFE of claim 1, wherein the ADC comprises a quantizer.

8. The impedance controlled AFE of claim 1, wherein the ADC comprises a voltage-controlled oscillator (VCO) quantizer.

9. The impedance controlled AFE of claim 1, wherein the ADC comprises a phase quantizer.

10. The impedance controlled AFE of claim 1, wherein the filter comprises an integrator.

11. The impedance controlled AFE of claim 1, wherein the impedance-based sensor is a capacitive sensor, and the first digitally controlled impedance is a first digitally controlled capacitance and the second digitally controlled impedance is a second digitally controlled capacitance.

12. The impedance controlled AFE of claim 11, wherein the first digitally controlled capacitance comprises a first digitally controlled varactor and the second digitally controlled capacitance comprises a second digitally controlled varactor.

13. The impedance controlled AFE of claim 12, wherein each of the digital controlled varactors includes a plurality of cells, each cell including a capacitance coupled between an output of the impedance-based sensor and one or more reference voltages.

14. The impedance controlled AFE of claim 1, where the impedance of the second digitally controlled impedance is based on the digital output of the ADC.

* * * * *